United States Patent [19]

Terneu et al.

[11] Patent Number: 5,203,903
[45] Date of Patent: Apr. 20, 1993

[54] METHOD OF COATING GLASS

[75] Inventors: Robert Terneu, Thiméon; Michel Hannotiau, Jodoigne, both of Belgium

[73] Assignee: Glaverbel, Brussels, Belgium

[21] Appl. No.: 746,728

[22] Filed: Aug. 19, 1991

[30] Foreign Application Priority Data

Aug. 31, 1990 [GB] United Kingdom ............... 9019069

[51] Int. Cl.$^5$ ............................................. C03C 25/02
[52] U.S. Cl. ................................... 65/60.2; 65/60.5; 65/60.8; 65/99.4
[58] Field of Search ............ 65/32.4, 60.2, 60.5, 65/60.8, 99.4, 182.5

[56] References Cited

U.S. PATENT DOCUMENTS

| | | | |
|---|---|---|---|
| 3,660,061 | 5/1972 | Donley et al. | 65/99.4 |
| 4,100,330 | 7/1978 | Donley | 65/32.4 |
| 4,123,244 | 10/1978 | Leclercq et al. | 65/60.8 |
| 4,129,434 | 12/1978 | Plumat et al. | 65/60.2 |
| 4,188,452 | 2/1980 | Groth | 428/336 |
| 4,329,379 | 5/1982 | Terneu et al. | 427/166 |
| 4,568,578 | 2/1986 | Arfsten et al. | 428/34 |
| 4,692,180 | 9/1987 | Villain et al. | 65/182.5 |
| 5,089,039 | 2/1992 | Terneu et al. | 65/60.8 X |

FOREIGN PATENT DOCUMENTS

| | | |
|---|---|---|
| 0071865 | 2/1983 | European Pat. Off. . |
| 0348185 | 12/1989 | European Pat. Off. . |
| 1136218 | 12/1968 | United Kingdom . |
| 2163146A | 2/1986 | United Kingdom . |
| 2199848A | 7/1988 | United Kingdom . |

Primary Examiner—Robert L. Lindsay
Attorney, Agent, or Firm—Spencer, Frank & Schneider

[57] ABSTRACT

In methods of forming a coating comprising a pyrolytically formed oxide layer on a travelling hot glass substrate, the substrate is contacted with coating precursor material in the presence of oxygen. In order to prevent interaction between the glass of the substrate and the coating precursor material used for applying an upper coating stratum, and/or to facilitate modification of the optical or other properties of the coating as a whole, an oxide substratum of said coating ("the undercoating layer") is pyrolytically formed in an incompletely oxidized state by contacting the substrate in an undercoating chamber with undercoat precursor material in the presence of oxygen in insufficient quantity for full oxidation of the undercoat material on the substrate and such undercoat is overcoated with an upper coating layer while it is still in an incompletely oxidized state, and while the substrate is still hot, thereby to preserve such undercoat in an incompletely oxidized state.

22 Claims, 2 Drawing Sheets

_5,203,903_

METHOD OF COATING GLASS

BACKGROUND OF THE INVENTION

1. Field of the Invention

This invention relates to a method of forming a coating comprising a pyrolytically formed oxide layer on a travelling hot glass substrate by contacting the substrate with coating precursor material in the presence of oxygen.

2. Background of the Art

It is well known to coat glass for various different purposes. Conductive coatings of various sorts may be applied in order to form part of an electric circuit or to reduce the emissivity of the coated surface in respect of infra red radiation. Reflective coatings for example of a metal may be applied in order to screen solar radiation, as may absorbent coatings.

The invention is particularly concerned with multi-layer coatings in which there is an undercoat of an oxide with one or more superposed layers which may be of oxide or other material.

It is also well known to make multi-layer coatings comprising an oxide undercoat and one or more superposed coating layers. There are various different reasons for applying a multi-layer pyrolytic coating, these having the principal aim of modifying the way in which the upper layer or layers is deposited, or of reducing interaction between the upper coating material and the glass of the substrate and/or of modifying the properties of the total coating, or of reducing interaction between an underlayer of the coating such as the oxide undercoat and atmosphere to protect that underlayer from pollution or indeed from abrasion and so conserve the properties which that underlayer confers on the panel.

It may be useful to prevent interaction between the glass of the substrate and the material of an upper coating layer. As an example, silicon oxide coatings may be used as undercoating layers to be overcoated with other coating layers which may be of one or more different oxides or other materials such as metals. The presence of a silicon oxide undercoating on soda-lime glass has the particular benefit of inhibiting the migration of sodium ions from the glass whether by diffusion or otherwise into an upper coating layer either during formation of that upper layer or during a subsequent high temperature treatment. As an example, it has been found that in the pyrolytic formation of a tin oxide coating from tin chloride on a soda-lime glass substrate, sodium chloride tends to become incorporated into the coating as a result of reaction of the glass with the coating precursor material or its reaction products, and this leads to haze in the coating.

Alternatively, it may be desired to modify the optical properties of a coating which is applied for radiation screening purposes. The radiation screening coatings particularly in view tend to be thin, and accordingly their aspect, whether viewed by transmitted or reflected light, is influenced by interference effects and minor variations in the coating thickness can have an important effect in modifying the apparent colour of the coating. In order to reduce the effect of thickness variations on the apparent colour of the coating, it has been proposed to provide an oxide undercoating, and this can have a highly beneficial effect in reducing undesired interference effects due to variations in the thickness of the total coating, provided that the optical thickness of that undercoat is itself well selected.

Alternatively again, it may be desired to provide an oxide undercoating which confers some special properties on the panel as a whole, and to protect that undercoating by an abrasion resistant coating which also serves to protect to undercoating from chemical attack by the ambient atmosphere.

SUMMARY OF THE INVENTION

It is a principal object of this invention to provide a process of forming a multi-layer pyrolytic coating on glass in which a coating underlayer has of itself certain special properties, or which acts in combination with at least one other coating layer to confer certain special properties on the coated glass.

According to the present invention, there is provided a method of forming a coating comprising a pyrolytically formed oxide layer on a travelling hot glass substrate by contacting the substrate with coating precursor material in the presence of oxygen, characterized in that an oxide substratum of said coating ("the undercoat") is pyrolytically formed in an incompletely oxidized state by contacting the substrate in an undercoating chamber with undercoat precursor material in the presence of oxygen in insufficient quantity for full oxidation of the undercoat material on the substrate and in that such undercoat is overcoated with an upper coating layer while it is still in an incompletely oxidized state, and while the substrate is still hot, thereby to preserve such undercoat in an incompletely oxidized state.

The invention thus provides a method of forming an incompletely oxidized undercoat followed by an upper coating layer which will preserve the properties of that undercoat of incompletely oxidized material thus conserving the properties afforded thereby. The expression "incompletely oxidized material" is used herein to denote a true sub-oxide, that is to say an oxide of a lower valency state of a multi-valent element (for example $VO_2$ or TiO), and also to denote an oxide material which contains oxygen gaps in its structure: an example of the latter material is $SiO_x$ where x is less than 2, which may have the general structure of $SiO_2$ but has a proportion of gaps which would be filled with oxygen in the dioxide.

The precise nature of the special properties which may be afforded by the undercoat of incompletely oxidized material will depend at least in part on the nature of that material.

For example, the undercoat may be constituted as a semi-conductor layer. Semi-conductor layers may be formed of zinc or cadmium oxides, of titanium oxide, or of vanadium dioxide, and such layers may readily be formed by a process according to the present invention to a given degree of oxidation, and they may be preserved in a state of incomplete oxidation by the overcoating layer. The overcoating layer or layers may readily be chosen to protect the undercoat against further oxidation due to atmospheric oxygen, against other chemical attack due to the ambient atmosphere, and against abrasion.

It is presently envisaged, however, that the present invention will find an important industrial use in the formation of undercoats of incompletely oxidized silicon oxide. As has been stated, the presence of a silicon oxide coating on soda-lime glass has a beneficial effect in reducing or eliminating sodium-poisoning of a superposed coating layer. Furthermore, and this is also very important, the refractive index of silicon oxide varies according to its state of oxidation and in relation to the gaps present in its structure. Thus the adoption of the present invention affords an additional control parameter for the formation of the undercoating layer, for example of silicon oxide, which facilitates control of the optical thickness of that undercoat. It is of course the optical thicknesses of the various coating layers which determines many of the optical and radiation transmitting properties of the coating as a whole, and the optical thickness of a coating layer is the product of the actual thickness and the refractive index of the material of which the coating layer is made. (In the case of interference reflection, the important factor may be double the product of the actual thickness and the refractive index.) Different oxides of various elements exhibit different refractive indices, and thus the present invention allows not only control of the actual thickness to which an undercoat is deposited, but also a measure of independent control of its optical thickness by appropriate selection of the degree of oxidation allowed in the undercoat.

It can be a very much simpler matter to control the degree of oxidation of the material of an undercoat than it is to control the precise thickness to which the undercoat and the overcoat are deposited, especially in the course of large scale series manufacture of coated glass. The coating apparatus may be set up to provide a uniform coating of approximately the required actual thickness, taking account of the nature of the coating material, and adjustment may be made to achieve the required optical thickness of that undercoat simply by controlling the quantity of oxygen which is allowed to enter the undercoating chamber.

If the undercoated glass substrate is exposed to an oxidizing atmosphere for a sufficiently long period of time, it may be expected that the undercoat will tend to become fully oxidized so that its desired properties are lost. In accordance with the invention therefore, such undercoat is overcoated with an upper coating layer while it is still in an incompletely oxidized state, and while the substrate is still hot, thereby to preserve such undercoat in an incompletely oxidized state. The time during which the freshly undercoated glass substrate may be exposed to an oxidizing atmosphere such as air and before the undercoat is overcoated, without damaging the properties of the undercoat, will depend on the temperature of the glass during such exposure and on the nature of the undercoat. However in general terms, for silicon oxides, an exposure time of fifteen seconds, and possibly up to half a minute may be tolerated. Such periods of time may be insufficient for completion of the oxidation of the undercoat, and the resulting increase in oxidation may be predictable and thus accommodated by altering the degree of oxidation permitted in the undercoating step proper.

Advantageously, said undercoating chamber is surrounded by a reducing atmosphere. The adoption of this feature assists in preventing ambient oxygen from entering the undercoating chamber and accordingly allows better control of the oxidizing conditions within that undercoating chamber.

The invention could be used for the formation of a sub-oxide coating on pre-cut and reheated glass sheets if this was required. However, when it is desired to manufacture pyrolytically coated flat glass, it is best to do so when the glass is newly formed. To do so has economic benefits in that there is no need to reheat the glass for the pyrolytic reactions to take place, and it also has benefits as to the quality of the coating, since it is assured that the surface of the glass is in pristine condition. Preferably, therefore, said undercoat precursor material is brought into contact with an upper face of a hot glass substrate constituted by freshly-formed flat glass.

The undercoating chamber could for example be located in or near the upstream end of an annealing lehr through which the ribbon advances, and the ribbon could be formed either in a drawing machine or in a float chamber.

However, we have found that certain problems arise in converting a lehr formerly used for annealing uncoated glass to form a lehr and two or more coating stations for the production of glass coated with a multilayer coating. Such problems arise as a result of the possibly different temperature conditions for forming the coating on the one hand and for proper annealing of the glass on the other, and as a result of constraints on the space available for locating the various coating stations. Furthermore, the coating reactions have a cooling effect on the glass, not only in that the glass is cooled overall, but also, the coated surface tends to be cooled more than the uncoated surface: thus a different temperature regime has often to be established within an annealing lehr equipped with two or more coating stations when changing from the production of coated glass to uncoated glass and back again, and sometimes even when a substantial change is made to the thickness of the coating applied to the glass.

In order to alleviate these problems, it is most preferred that said undercoat precursor material is brought into contact with an upper face of a hot float glass substrate in a said undercoating chamber located within a float chamber in which the float glass is manufactured.

By operating according to this preferred embodiment of the invention and forming the undercoating within the float chamber, any necessity for finding space for the undercoating station in or near the upstream end of an annealing lehr is avoided. Furthermore, we have found that it is possible to ensure that the temperature of the glass ribbon leaving the float chamber is substantially unaffected whether the ribbon is undercoated or not, and accordingly there is no need to modify the temperature regime in an annealing lehr when switching that undercoating chamber into or out of operation.

It is rather surprising to propose to form an oxide undercoating within a float chamber. Float chambers contain a bath of molten metal, wholly or mainly tin, which is rather easily oxidizable at the temperatures required for the glass ribbon to spread out and become fire-polished, and accordingly it is universal practice to maintain a reducing atmosphere within the float chamber, because any surface dross picked up by the glass ribbon from the surface of the metal bath would be a source of defects in the glass produced. Typically such atmosphere contains about 92% to 95% nitrogen and about 8% to 5% hydrogen and it is maintained at a slight overpressure to prevent oxygen from leaking into the float chamber from the ambient atmosphere. Much research has also gone into removing dross which almost always forms on the surface of the metal bath despite all the precautions taken to avoid allowing oxygen into the float chamber. It therefore goes against the tide of the teaching about the production of float glass deliberately to maintain oxidizing conditions in the float chamber. We have however found that it is possible to create oxidizing conditions within a float chamber without giving rise to the expected problems. We believe that this is at least in part due to the fact that said undercoating precursor material is brought into contact with said face in an undercoating chamber. The use of an undercoating chamber facilitates confinement of the oxidizing conditions, of the undercoating precursor material, and of the undercoating reaction products so that their effect on the bath of metal in the float chamber can be rendered small or negligible.

Placing the undercoating chamber within a float chamber is also a very simple way of ensuring that the undercoating chamber is surrounded by a reducing atmosphere, and it requires the provision of no additional equipment in order to maintain that atmosphere.

The undercoating may be formed at any position along the float chamber downstream of the position where the ribbon has reached its final width, and the actual position selected will depend on the temperature desired for initiating coating of the glass. The glass is withdrawn from the float chamber for passage to the annealing lehr at a temperature which is usually in the range of 570° C. to 650° C. Ribbon temperatures above 570° C. are inherently suitable for the pyrolytic coating reactions to take place, so the coating station could in fact be located quite close to the exit from the float chamber. Preferably, however, the coating precursor material contacts the glass at a position along the float chamber such that the glass has a temperature which is at least 50° C. and preferably at least 100° C. higher than the temperature at which the glass would exit from the float chamber if no coating were formed therein. The adoption of this preferred feature of the invention affords the advantage that there is ample time for the ribbon to regain heat given up during the coating reactions so that when it does leave the float chamber, its temperature is substantially unaffected by the undercoating operation.

Even if the glass is not undercoated within a float chamber, it is preferred that the substrate reaches the undercoating chamber with a temperature of at least 400° C. Such temperatures are very suitable for the rapid formation of, for example, a silicon oxide coating from a silane-containing coating precursor. It is also to be noted that as a general rule, the higher the temperature of the glass during coating formation, the more rapid is the coating reaction so that the coating yield, that is, the proportion of coating precursor material which is converted into useful coating oxide, is increased, and for a given speed of ribbon advance, it is possible to form a thicker coating if desired. For this reason also, it is preferred that the undercoat precursor material first contacts the glass when the glass has a temperature of at least 650° C. For many purposes, the glass may have a temperature of between 700° C. and 750° C. when it is first contacted by the undercoat precursor material.

The oxygen required for the undercoating reactions is preferably present in the form of molecular oxygen. It may be supplied as pure oxygen, but this adds unnecessarily to costs, and it is accordingly preferred that air is supplied to the undercoating chamber in order to introduce oxygen thereto.

Advantageously, said undercoat precursor material is selected to contain silicon for the formation of a silicon oxide undercoat on the glass. Silicon oxide coatings are useful as undercoats for various purposes. It is especially suitable to use an undercoat precursor material which comprises a silane.

The use of a silane, in particular $SiH_4$ is well known per se for the formation of pyrolytic coatings on glass. Silane decomposes at temperatures above 400° C., and silicon coatings may be formed. It is difficult, however, to oxidize such a silicon coating in situ to form a silicon oxide coating. For this reason, it is preferable to react the silane directly with oxygen. In order that this reaction should take place to deposit silicon oxide on the glass substrate rather than on some part of the coating apparatus, all previously published proposals for the use of a silane containing coating precursor material in the formation of a silicon oxide coating have insisted that the coating precursor material should only be allowed to mix with oxygen within a coating chamber which is open to the substrate to be coated, at a location where those materials are free to contact the substrate directly. We, however, have found that this is not favourable for the production of high quality silicon oxide coatings.

In the most preferred embodiments of this invention, the silane-containing undercoat precursor material is intimately mixed with oxygen before it is allowed to contact the glass. We have found that this early mixing of the undercoating reagents affords great benefits in the achievement of a uniform undercoating across the width of the substrate. Surprisingly, the early mixing does not lead to such premature reaction of the coating precursor material as would be expected from the teaching of the prior art, and it is in fact favourable for the production of high quality silicon oxide coatings.

In preferred embodiments of the invention, silane as coating precursor material is conveyed towards the coating chamber in vapour phase in a substantially inert carrier gas stream and oxygen is introduced into the silane-containing carrier gas stream before it enters the coating chamber. While it is desirable to have the oxygen and coating precursor silane intimately mixed before entry into the coating chamber, it is also an advantage to be able to control the length of time for which those reagents are mixed prior to supply to the coating chamber. Conveying the silane towards the coating chamber in a substantially inert carrier gas stream and then introducing oxygen to that carrier gas stream allows selection of the point where oxygen is to be introduced in order to achieve that control.

Advantageously, nitrogen is used as substantially inert carrier gas. Nitrogen is sufficiently inert for the purposes in view, and it is inexpensive when compared with the noble gases.

The coating precursor and/or the oxygen may conveniently be introduced into the carrier gas stream by means of a venturi.

In preferred embodiments, turbulence is induced in the carrier gas stream to ensure intimate mixing of the substantially inert carrier gas and the silane. A certain amount of turbulence will be induced if a venturi is used as aforesaid, but this may be augmented for example by the use of a supply line which has a constriction downstream of the coating precursor introduction point. Such a constriction may be asymmetrical. Intimate mixing of the precursor into the carrier gas is ensured by inducing turbulence.

For similar reasons, it is advantageous that turbulence is induced in the carrier gas stream after the introduction of oxygen thereto to ensure intimate mixing of the silane-containing carrier gas and the oxygen.

The rate at which the coating reagents are to be supplied is to some extent dependent upon the desired thickness of the undercoat to be formed and upon the speed at which the substrate passes the undercoating chamber. Preferably, silane as undercoating precursor material is introduced into the undercoating chamber with a partial pressure of between 0.1% and 1.5%. A concentration within that range is suitable for forming undercoatings from about 30 nm to about 240 nm on a substrate travelling at up to 20 meters per minute.

Advantageously, for the production of coated glass which travels at a speed of less than about 10 meters per minute, silane as undercoating precursor material is introduced into the undercoating chamber with a partial pressure of between 0.1% and 0.4%.

Preferably, steps are taken to limit the transfer of heat energy to the undercoating precursor material as it travels towards the glass. This maintains the temperature of the coating reagents at a lower level than environmental conditions would otherwise dictate, and further assists in reducing any tendency for premature reaction.

Advantageously, undercoating precursor material is supplied to contact the glass via at least one slot which extends, or which together extend, across at least the major part of the width of the undercoat which is to be formed on the glass. This facilitates the formation of an undercoat having a uniform thickness across the width of the glass substrate.

Advantageously, the undercoating precursor material contacts the glass within a said undercoating chamber, which chamber is defined by the substrate path and a downwardly opening hood, and the undercoating chamber is aspirated around substantially the whole of its periphery. This assists in preventing the escape of unused undercoating precursor and coating reaction products from the undercoating chamber to the surrounding space.

Preferably, such aspiration induces an inward flow of ambient atmosphere surrounding substantially the entire periphery of the undercoating chamber. This creates a pneumatic seal between the oxidizing conditions within the coating chamber and the ambient atmosphere, which is especially valuable in preventing the escape of oxidizing atmosphere from the undercoating chamber when that chamber is located within a float chamber.

BRIEF DESCRIPTION OF THE DRAWINGS

The invention will now be described in greater detail with reference to the accompanying drawings and by way of example only.

In the drawings.

DESCRIPTION OF THE PREFERRED EMBODIMENTS

Figure 1:
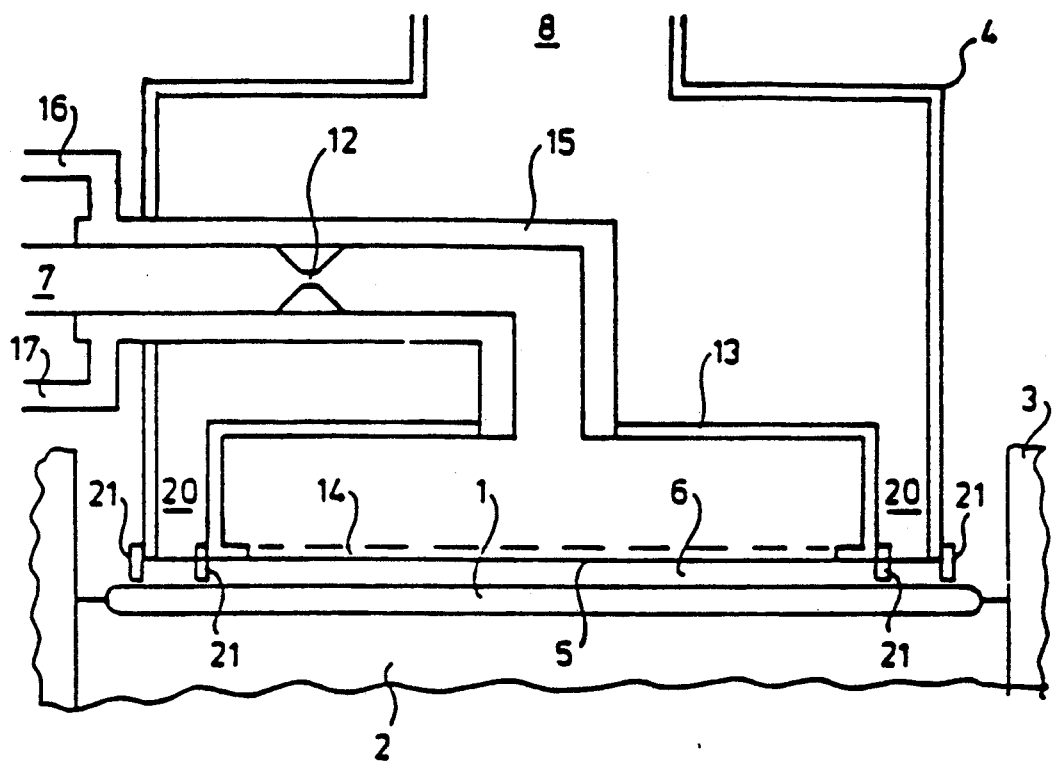
FIG. 1 is a transverse cross sectional view of an undercoating apparatus located in a float chamber.

In the drawings, a ribbon 1 of glass is advanced along a path also indicated at 1 while it is supported by a bath of molten metal 2 contained within a float chamber 3. An undercoating station is surrounded by a wall and roof structure generally indicated at 4.

The undercoating station 4 comprises a hood 5 which defines a undercoating chamber 6 opening downwardly onto the ribbon path 1, a supply line 7 for feeding undercoating reagents to the undercoating chamber 6, and a chimney 8 for aspirating peripherally around the undercoating chamber.

The supply line 7 is fed with a substantially inert carrier gas such as nitrogen from a source which is not shown, and the undercoating precursor material such as silane is introduced into the carrier gas stream at a first venturi 9. silane to the undercoating chamber. The carrier gas stream with dispersed undercoating precursor flows along the supply line 7 to a first constriction 10 which is arranged to impart turbulence to the carrier gas stream to ensure intimate mixing of the carrier gas and the entrained undercoating precursor material. Further downstream, a second venturi 11 is provided for the introduction of oxygen, for example as a constituent of air. A further turbulence-inducing constriction 12 ensures intimate mixing of the oxygen and the entrained undercoating precursor material in the carrier gas stream. The undercoating reagents are fed by supply line 7 to a flow control block 13 having an exit slot 14 which extends across the major part of the width of the hood 5.

Figure 4:
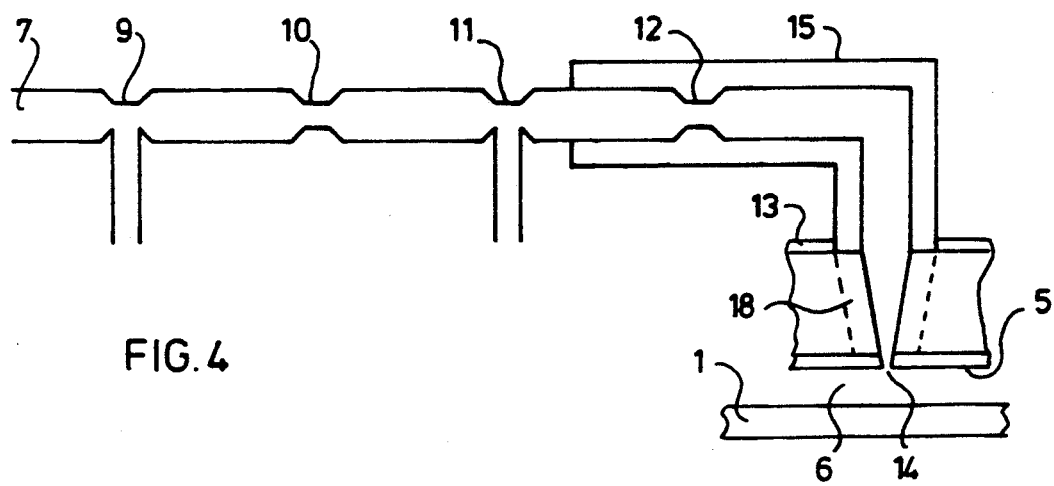
FIG. 4 illustrates the supply of undercoating reagents to a supply line feeding the undercoating station.

It is convenient to feed undercoating precursor material and oxygen to the supply line 7 outside the float chamber 3. At all parts within the float chamber 3, the supply line is surrounded with a cooling jacket 15 which is equipped with cooling water inlet 16 and outlet 17 as shown in FIG. 1. If desired, the cooling jacket may be extended within the flow control block 13 as shown at 18 in dotted lines in FIGS. 2 and 4 so that the undercoating reagents are protected against over-heating until they exit from the slot 14 for contact with the ribbon 1 in the undercoating chamber 6.

Figure 2:
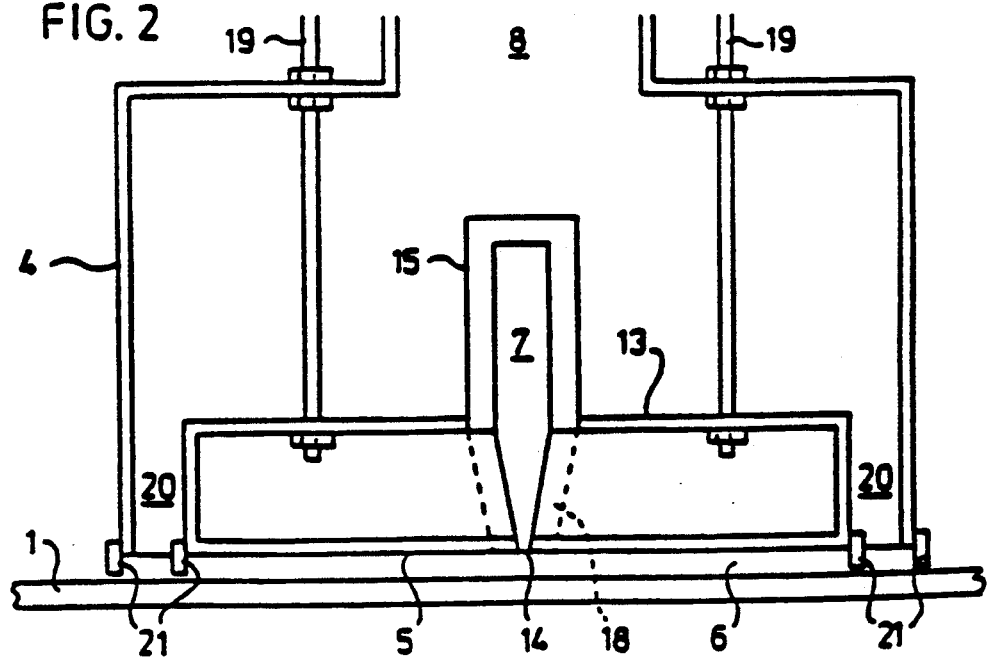
FIG. 2 is a longitudinal cross sectional view of the undercoating apparatus of FIG. 1.
Figure 3:
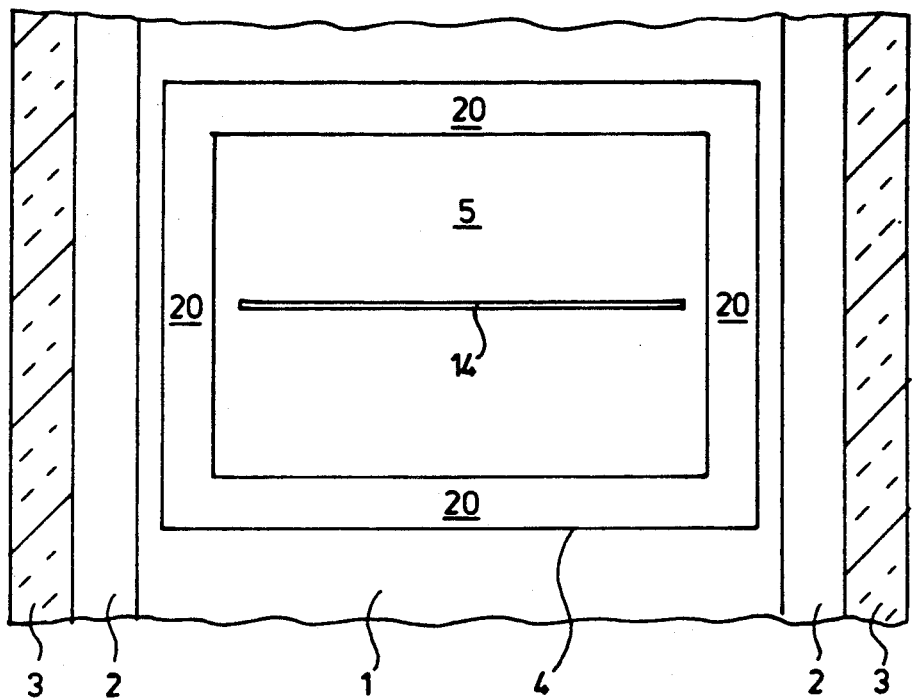
FIG. 3 is a diagrammatic plan view of the undercoating apparatus.

As shown in FIG. 2, the hood 5 and flow control block 13 are suitably suspended from the roof of the float chamber 3 by means of struts 19. It is desirable to use threaded struts 19 so that the height of the base of the hood 5 can be adjusted for small clearance, for example 2 cm or less, from the ribbon path 1.

The hood 5, the undercoating chamber 6, and the flow control block 13 are surrounded by a peripheral passage 20 via which undercoating reaction products and unused undercoating precursor material together with, if desired, inwardly aspirated ambient atmospheric material from the float chamber can be upwardly aspirated through chimney 8. The hood 5 and undercoating station wall structure 4 are shown provided with optional peripherally extending skirts 21 at the base of the peripheral passage 20. Those skirts are suitably constituted by flexible refractory curtains for example made of Refrasil (Trade Mark).

After the glass ribbon has left the float chamber 3 it is passed to an overcoating station (not shown) located close to the exit end of the float chamber. The overcoating chamber itself may be of a type known per se and located at or before the upstream end of a horizontal annealing lehr through which the ribbon is passed before it is cut into sheets. It is desirable that there be a closed passage between the exit end of the float chamber and the entrance to the overcoating chamber, especially if that passage is more than a few meters long, and also that that passage be filled with a non-oxidizing or reducing atmosphere. This can readily be accomplished by blowing nitrogen along in contact with the newly formed undercoat, and may be supplemented by leakage of the float chamber atmosphere along that passage.

EXAMPLE 1

In a specific practical embodiment, for coating float glass advancing at a speed of 7 meters per minute along a float chamber, the coating station is located at a position along the float chamber where the glass is at a temperature of about 700° C. The supply line is fed with nitrogen, and silane is introduced thereto with a partial pressure of 0.2%, and oxygen is introduced with a partial pressure of 0.36% (ratio 0.55). A coating of silicon oxide $SiO_x$ where x is approximately equal to 1.8 is obtained with a refractive index of about 1.69. The coating which is formed has a thickness of 75 nm. The coating precursor material in its carrier gas is fed along the supply line 7 to exit a slot about 4 mm wide at such a rate that the supplied material flows along between the glass and the hood 5, which is 15 mm above the path 1 of the glass, at a speed of about 2 to 3 meters per second in both directions parallel to the direction of ribbon advance. The hood 5 has a length in that direction of about 40 cm. Atmospheric material is aspirated through the chimney 8 at such a rate as to generate an upward flow of gases in the peripheral passage 20 with a velocity of about 7 to 8 meters per second, and this causes a continuous inward flow of gas from the float chamber into the base of the passage 20 around the entire periphery of the coating chamber 6, so preventing escape into the float chamber of the coating reagents or their reaction products. Of course, such aspiration also draws off coating reaction products and unused coating reagents.

In a subsequent coating step, performed in a manner known per se in a coating station located close to the exit from the float chamber and before the upstream end of horizontal annealing lehr, an upper coating layer of doped $SnO_2$ is formed to a thickness of 225 nm by pyrolysis of $SnCl_2$ in aqueous solution. A tolerance of ±45 nm in the thickness of the $SnO_2$ overcoat and of ±4 nm in the undercoat can be accepted without giving rise to unwanted colour variations due to interference effects.

In the absence of an undercoating, such a tin oxide layer presents a greenish dominant wavelength in reflection, and it may appear greenish yellow or greenish blue according to the precise thickness from place to place. A quantitative assessment of the light modifying power of the coating may be given in terms of the well known Hunter co-ordinates. In the absence of the undercoat, such a tin oxide coating has a Hunter 'a' co-ordinate of between −6 and −7, and a Hunter 'b' co-ordinate of between −7 and +5. In the case of the two layer coating of this Example, however, with the silicon oxide undercoat of about 75 nm having a refractive index of 1.69 to 1.7, the Hunter 'a' and 'b' co-ordinates were both between +2 and −2, thus giving a much more evenly neutral product.

EXAMPLE 2

It is required to produce glass coated with a layer of doped tin oxide about 500 nm in thickness for screening long wavelength infra-red radiation. Such a coating may readily be formed by a technique known per se. Variations in thickness can present variations in tint across the coated panel from greenish (Hunter 'a' co-ordinate −15) to reddish (Hunter 'a' co-ordinate +7) which are thought to be commercially unacceptable.

Therefore the glass is first provided with an undercoat of incompletely oxidized silicon oxide having a thickness of 80 nm and a refractive index of 1.75±0.01. This is readily done by adjusting the flow rates of the silane and the oxygen into the undercoating chamber in the process described in Example 1. This undercoat has the effect of alleviating colour variations due to interference effects so that for thickness variations in the overcoat of up to ±30 nm, the Hunter 'a' and 'b' co-ordinates were both between +2 and −2, thus giving a much more evenly neutral product. This remains true for variations of up to ±5 nm in the thickness of the undercoat.

EXAMPLE 3

A low emissivity coating of doped zinc oxide is to be formed to a thickness of 310 nm by pyrolysis of zinc acetate dissolved in aqueous isopropanol as overcoating precursor material. Indium chloride is added to the overcoating precursor material to provide the required doping ions.

In accordance with the invention, the glass is first provided with an undercoat, in this Example of incompletely oxidized silicon oxide having a thickness of 73 nm and a refractive index of 1.79, and the overcoating is applied to preserve this incomplete state of oxidation. This is readily done by adjusting the flow rates of the silane and the oxygen into the undercoating chamber in the process described in Example 1. This too has the effect of markedly alleviating colour variations due to variations in the thickness of the overcoating layer. The Hunter 'a' and 'b' co-ordinates were both between +2 and −2.

Variations in the thickness of the overcoat of up to ±10 nm, and variations in the thickness of the undercoat of up to ±3 nm could be tolerated without giving rise to perceptible variations of the tint of the coated glass when viewed in reflection.

EXAMPLE 4

A low emissivity coating of doped zinc oxide is to be formed to a thickness of 505 nm, again by pyrolysis of zinc acetate dissolved in aqueous isopropanol as overcoating precursor material. Indium chloride is added to the overcoating precursor material to provide the required doping ions.

In accordance with the invention, the glass is first provided with an undercoat, in this Example of incompletely oxidized silicon oxide having a thickness of 78 nm and a refractive index of 1.8, and the overcoating is applied to preserve this incomplete state of oxidation. This is readily done by adjusting the flow rates of the silane and the oxygen into the undercoating chamber in the process described in Example 1. This too has the effect of markedly alleviating colour variations due to variations in the thickness of the overcoating layer. The Hunter 'a' and 'b' co-ordinates were both between +2 and −2.

Variations in the thickness of the overcoat of up to ±5 nm, and variations in the thickness of the undercoat of up to ±2 nm could be tolerated without giving rise to perceptible variations of the tint of the coated glass when viewed in reflection.

EXAMPLE 5

A low emissivity coating of indium tin oxide is to be formed to a thickness of 300 nm by pyrolysis of indium chloride and tin chloride dissolved in dimethylformamide as overcoating precursor material in a coating technique known per se.

In accordance with the invention, the glass is first provided with an undercoat, in this Example of incompletely oxidized silicon oxide having a thickness of 74 nm and a refractive index of 1.77, and the overcoating is applied to preserve this incomplete state of oxidation. This is readily done by adjusting the flow rates of the silane and the oxygen into the undercoating chamber in the process described in Example 1. This too has the effect of markedly alleviating colour variations due to variations in the thickness of the overcoating layer. The Hunter 'a' and 'b' co-ordinates were both between +2 and −2.

Variations in the thickness of the overcoat of up to ±10 nm, and variations in the thickness of the undercoat of up to ±2 nm could be tolerated without giving rise to perceptible variations of the tint of the coated glass when viewed in reflection.

EXAMPLE 6

A low emissivity coating of indium tin oxide is to be formed to a thickness of 500 nm.

In accordance with the invention, the glass is first provided with an undercoat, in this Example of incompletely oxidized silicon oxide having a thickness of 85 nm and a refractive index of 1.8, and the overcoating is applied to preserve this incomplete state of oxidation. This is readily done by adjusting the flow rates of the silane and the oxygen into the undercoating chamber in the process described in Example 1. This too has the effect of markedly alleviating colour variations due to variations in the thickness of the overcoating layer. The Hunter 'a' and 'b' co-ordinates were both between +2 and −2.

Variations in the thickness of the overcoat of up to ±5 nm, and variations in the thickness of the undercoat of up to ±1 nm could be tolerated without giving rise to perceptible variations of the tint of the coated glass when viewed in reflection.

EXAMPLE 7

A semi-conductive undercoat is formed of incompletely oxidized zinc by contacting a glass ribbon in an undercoating chamber within a float chamber with metallic zinc vapour in the presence of oxygen in insufficient quantity for complete oxidation of the zinc coating thus formed on the glass.

The semi-conductive ZnOx undercoat is then overcoated by a conductive coating 500 nm thick formed of doped tin oxide which serves to preserve the ZnOx layer in an incompletely oxidized state so that it can function as a semi-conductor, and at the same time serves as an electrode in the finished product.

EXAMPLE 8

A glass ribbon within a float chamber is first provided with a subbing layer of silicon dioxide 90 nm thick. This may be done by modifying the process described in Example 1 so that sufficient oxygen is used for full oxidation of the silicon. To do this, silane is introduced into the subbing layer coating station with a partial pressure of 0.25%, and oxygen is introduced with a partial pressure of 0.5% (ratio 0.5).

That subbing layer serves to prevent sodium poisoning of a subsequently applied undercoat of a sub-oxide of vanadium. An undercoat of vanadium dioxide is formed in an undercoating station also located in the float chamber, downstream of the subbing layer coating station, by contacting the subbing layer on the glass with vanadium trichloride in the vapour phase in the presence of insufficient oxygen for complete oxidation of the vanadium in the sub-oxide undercoat formed on that subbing layer.

In accordance with the invention, the vanadium dioxide in overcoated while it is still in a state of incomplete oxidation. A 500 nm thick overcoating layer of tin oxide is applied to the undercoat outside the float chamber prior to annealing of the ribbon.

What is claimed is:

1. A method of forming a coating comprising a pyrolytically formed oxide layer on a travelling hot glass substrate by contacting the travelling hot glass substrate with coating precursor material in the presence of oxygen, the method comprising:

pyrolytically forming an undercoating layer which is an oxide substratum of said coating and is in an incompletely oxidized state by contacting a surface of the travelling hot glass substrate in an undercoating chamber with an undercoating precursor material in the presence of molecular oxygen in insufficient quantity for full oxidation of the undercoating precursor material on the substrate; and overcoating the undercoating layer formed on the surface of the hot glass substrate with an upper coating layer while the undercoating layer is still in an incompletely oxidized state and while the travelling hot glass substrate is still hot to thereby preserve the undercoating layer in an incompletely oxidized state.

2. The method according to claim 1, wherein said undercoating precursor material is brought into contact with an upper face of a travelling hot glass substrate which is a freshly-formed flat glass.

3. The method according to claim 1, wherein said undercoating chamber is surrounded by a reducing atmosphere.

4. The method according to claim 2, wherein said undercoating precursor material is brought into contact with an upper face of a travelling hot float glass substrate in an undercoating chamber which is surrounded by a reducing atmosphere and which is located within a float chamber in which the float glass is manufactured.

5. The method according to claim 4, wherein the travelling hot float glass has a float chamber exit temperature characteristic thereof if no coating is formed thereon, and wherein the undercoating precursor material contacts the travelling hot float glass at a position within the float chamber where the travelling hot float glass has a temperature which is at least 50° C. higher than the float chamber exit temperature.

6. The method according to claim 1, wherein the travelling substrate reaches the undercoating chamber with a temperature of at least 400° C.

7. The method according to claim 6, wherein the undercoating precursor material first contacts the travelling hot glass substrate when the travelling hot glass substrate has a temperature of at least 650° C.

8. The method according to claim 5, wherein the undercoating precursor material contacts the travelling hot float glass at a position within the float chamber where the travelling hot float glass has a temperature which is at least 100° C. higher than the float chamber exit temperature.

9. The method according to claim 1, wherein oxygen is supplied as air to the undercoating chamber in order to introduce oxygen therein.

10. The method according to claim 1, wherein said undercoating precursor material contains silicon for the formation of a silicon oxide undercoating layer on the travelling hot glass substrate.

11. The method according to claim 10, wherein the undercoating precursor material comprise a silane.

12. The method according to claim 11, wherein the silane-containing undercoating precursor material is intimately mixed with oxygen before it is allowed to contact the travelling hot glass substrate.

13. The method according to claim 11, wherein the silane in the undercoating precursor material is conveyed towards the undercoating chamber in vapour phase by a stream of carrier gas which is substantially inert, and wherein oxygen is introduced into the silane-containing carrier gas stream before it enters the undercoating chamber.

14. The method according to claim 13, wherein the carrier gas is nitrogen.

15. The method according to claim 13, wherein turbulence is induced in the stream of carrier gas to ensure intimate mixing of the carrier gas and the silane.

16. The method according to claim 13, wherein turbulence is induced in the stream of carrier gas after the introduction of oxygen therein to ensure intimate mixing of the silane-containing carrier gas and the oxygen.

17. The method according to claim 1, wherein the undercoating precursor material is a silane introduced into the undercoating chamber with a partial pressure ranging between 0.1% and 1.5%.

18. The method according to claim 17, wherein the undercoating precursor material is a silane introduced into the undercoating chamber with a partial pressure ranging between 0.1% and 0.4%.

19. The method according to claim 1, wherein heat energy transfer to the undercoating precursor material as it travels towards the travelling hot glass substrate is limited by surrounding a supply line for the undercoating precursor material with a cooling jacket.

20. The method according to claim 1, wherein the undercoating layer has a width and wherein the undercoating precursor material is supplied to contact the travelling hot glass substrate via at least one slot which extends across at least the major part of the width of the undercoating layer which is to be formed on the travelling hot glass substrate.

21. The method according to claim 1, wherein the travelling hot glass substrate has a substrate path, wherein the undercoating chamber is defined by the substrate path and by a downwardly opening hood, and wherein the undercoating chamber has a periphery which is aspirated around substantially the whole thereof.

22. The method according to claim 21, wherein aspiration induces an inward flow of ambient atmosphere which substantially surrounds the periphery of the undercoating chamber.

* * * * *